(12) United States Patent
Kanagawa

(10) Patent No.: US 6,736,556 B2
(45) Date of Patent: May 18, 2004

(54) SUBSTRATE PROCESSING APPARATUS

(75) Inventor: Kouzou Kanagawa, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/310,859

(22) Filed: Dec. 6, 2002

(65) Prior Publication Data
US 2003/0108349 A1 Jun. 12, 2003

(30) Foreign Application Priority Data
Dec. 10, 2001 (JP) .................................. 2001-375718

(51) Int. Cl.$^7$ .................................................. G03D 5/00
(52) U.S. Cl. .................. 396/579; 396/604; 396/611; 396/627; 118/52; 118/319; 355/30; 427/240
(58) Field of Search ................................ 396/579, 604, 396/611, 627; 355/30; 427/240; 118/52, 319–321; 34/82, 603

(56) References Cited

U.S. PATENT DOCUMENTS 6,004,047 A    12/1999  Akimoto et al.
6,312,171 B1   11/2001  Matsuyama et al.

Primary Examiner—D. Rutledge
(74) Attorney, Agent, or Firm—Rader, Fishman & Grauer PLLC

(57) ABSTRACT

A resist coating unit includes a coater cup surrounding a wafer W held by a spin chuck and an air supply mechanism for blowing an air into the coater cup. The air supply mechanism includes a hollow frame having a first open portion formed in the vertical wall, an air blowing device for blowing an air into the hollow frame, and a filter chamber unit into which the air within the frame is introduced. The filter chamber unit includes a first air introducing chamber having a heater arranged therein, a second air introducing chamber, an air stream control mechanism, and a filter unit. The air flowing within the frame flows into the first air introducing chamber through the first open portion so as to be uniformly heated by the heater and, then, is introduced into the second air introducing chamber. Then, the air uniformly heated by the heater is blown into the coater cup through the air stream control mechanism and the filter unit.

10 Claims, 8 Drawing Sheets

SUBSTRATE PROCESSING APPARATUS

BACKGROUND OF THE INVENTION

1. Field of the Invention

The present invention relates to a substrate processing apparatus used for carrying out a film-forming process for coating a substrate such as a semiconductor wafer with a resist solution or for applying a developing process to the substrate having an exposure treatment applied thereto.

2. Description of the Related Art

In the manufacturing process of, for example, a semiconductor device, a prescribed circuit pattern is formed on the surface of a semiconductor wafer by using a so-called "photolithography technology". A series of processing in this photolithography process are carried out by using, for example, a resist coating and developing system such that a cleaned semiconductor wafer is coated with a photoresist solution so as to form a resist film, followed by exposing the resist film to light in a prescribed pattern and subsequently developing the exposed resist film.

A spin coating method is widely employed for the coating processing with a resist solution. In the spin coating method, a wafer is held on a spin chuck arranged within a coater cup, and a prescribed amount of a resist solution is dripped from above onto the central portion of the water while rotating the wafer together with the spin chuck. As a result, the dripped resist solution is centrifugally expanded toward the periphery of the wafer, thereby forming a resist film having a prescribed thickness.

If the temperature or humidity within the coater cup is changed in the spin coating method during the period between the dripping of the resist solution and the expansion of the dripped resist solution to form a film, the thickness of the formed resist film is changed. Therefore, in order to maintain constant the thickness of the resist film, the temperature and humidity within the coater cup are maintained constant by blowing an air whose temperature and humidity are controlled from above the coater cup into the coater cup.

In the manufacturing process of a semiconductor device in recent years, it is desirable to further decrease the thickness of the resist film formed on the semiconductor wafer. In this connection, it is required to blow an air having a uniform temperature distribution into the coater cup in order to form a thin resist film having a uniform thickness.

However, the conventional apparatus is defective in that the air blown into the coater cup is greatly nonuniform in the temperature distribution. Also, where the blowing rate of the air is changed, the nonuniformity of the temperature distribution is rendered more serious.

BRIEF SUMMARY OF THE INVENTION

A first object of the present invention is to provide a substrate processing apparatus in which an air excellent in the uniformity of the temperature distribution is supplied into a substrate process section for processing the substrate.

Also, a second object of the present invention is to provide a substrate processing apparatus in which the uniformity in the temperature distribution of the blown air is maintained constant even in the case where the blowing rate of the air into the substrate process section is changed.

According to an aspect of the present invention, there is provided a substrate processing apparatus, comprising:

a substrate process section for applying a prescribed processing to a substrate; and an air supply mechanism for supplying an air controlled at a prescribed temperature from above the substrate process section into the substrate process section;

wherein, said air supply mechanism comprises:

a tubular body having a substantially vertical wall and extending in a horizontal direction;

an air blowing device for blowing an air into said tubular body;

a first open portion formed in said vertical wall;

a first air introducing chamber arranged in a direction perpendicular to the longitudinal direction of the tubular body for taking in an air flowing within the tubular body through said first open portion and having a wall section facing said vertical wall;

a heater arranged within said first air introducing chamber for heating the air introduced into the first air introducing chamber;

a second open portion formed on the upper side in the central portion of the wall section of the first air introducing chamber;

a second air introducing chamber communicating with the first air introducing chamber via said second open portion and taking in the air heated by said heater through the second open portion;

a filter unit arranged below said second air introducing chamber for filtering the air introduced into the second air introducing chamber so as to supply a clean air into said substrate process section; and an air stream control mechanism arranged between the second air introducing chamber and said filter unit for controlling the flow of the air from the second air introducing chamber into the filter unit.

According to the substrate processing apparatus of the present invention, it is possible to blow an air excellent in the uniformity of the temperature distribution into the substrate process section because used is an air supply mechanism in which the blowing state of the air is controlled at a plurality of points. As a result, the quality of the substrate can be enhanced, leading to an improved reliability of the manufactured semiconductor device. Also, the air blowing rate can be changed easily in accordance with various treatments applied to the substrate. For example, in the case of changing the air blowing rate from the first open portion into the first air introducing section, it is possible to prevent the uniformity of the temperature distribution of the air blown into the substrate process section from being decreased by changing the open area of the second open portion or by allowing the air stream control mechanism to change the air blowing rate.

DETAILED DESCRIPTION OF THE INVENTION

The present invention will now be described in detail with reference to the accompanying drawings. The following description covers the case where the technical idea of the present invention is applied to a resist coating unit for forming a resist film on a wafer, which is mounted to a resist coating and developing system used for carrying out a series of processing ranging between the resist coating on a semiconductor wafer and the development.

Figure 1:
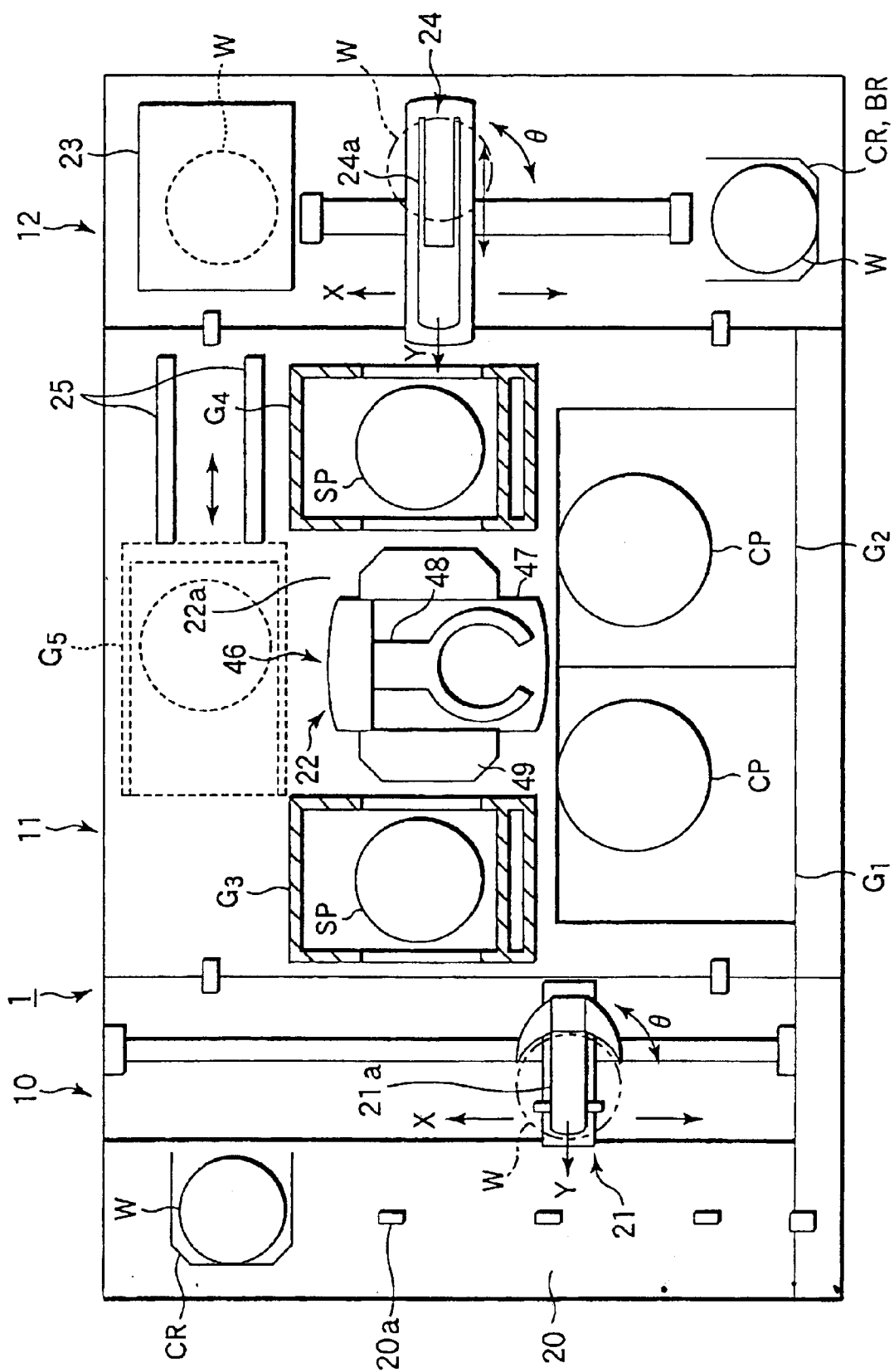
FIG. 1 is a plan view schematically showing the construction of the resist coating and developing system of the present invention.
Figure 2:
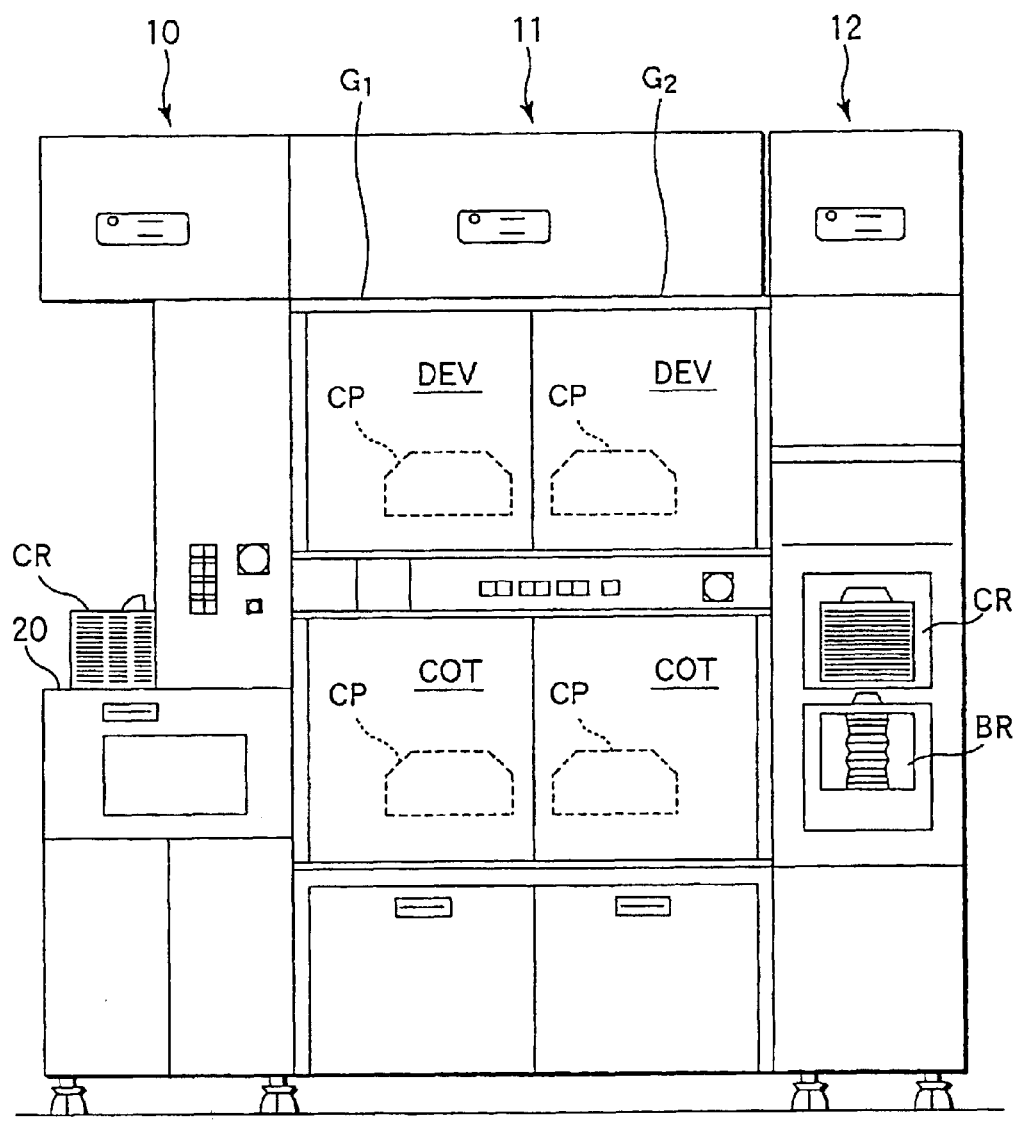
FIG. 2 is a front view schematically showing the construction of the resist coating and developing system shown in FIG. 1.
Figure 3:
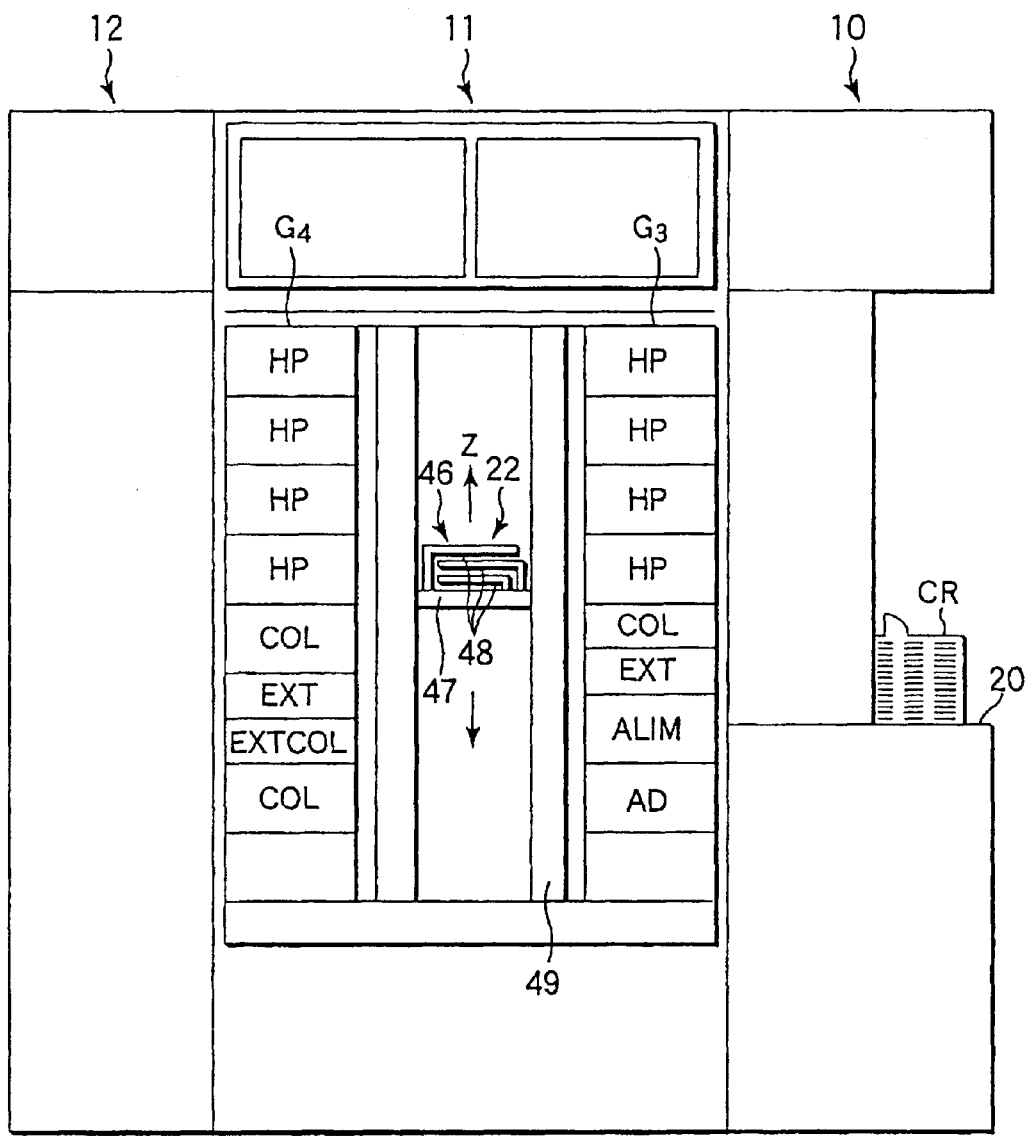
FIG. 3 is a back view schematically showing the construction of the resist coating and developing system shown in FIG. 1.

FIG. 1 is a plan view schematically showing the construction of a resist coating and developing system 1, FIG. 2 is a front view schematically showing the construction of the resist coating and developing system shown in FIG. 1, and FIG. 3 is a back view schematically showing the construction of the resist coating and developing system shown in FIG. 1. As shown in the drawing, the resist coating and developing system 1 comprises a cassette station 10 acting as a transfer station, a process station 11 provided with a plurality of process units, and an interface section 12 arranged contiguous to the process station 11 for the delivery of a wafer W between the process station 11 and an exposure device (not shown).

As shown in FIG. 1, the cassette station 10 includes a cassette table 20 on which is disposed a wafer cassette CR housing a plurality of wafers W to be processed, e.g., housing 20 wafers W, for transferring the cassette CR from another system into the resist coating and developing system 1 or from the resist coating and developing system 1 into the other system.

A plurality of projections 20a for the position determination, e.g., four projections 20a, are arranged on the cassette table 20 in a manner to form an array extending in the X-direction in the drawing. The wafer cassettes CR are arranged on the positions of the projections 20a in a manner to form a row such that the inlet-outlet port of each of the wafer cassettes CR is positioned to face the process station 11. Incidentally, a plurality of wafers W are arranged to assume a substantially horizontal posture and to be apart from each other in the vertical direction within each wafer cassette CR.

The cassette station 10 also includes a wafer transfer mechanism 21 arranged between the cassette table 20 and the process station 11 so as to permit the wafer W to be transferred between the wafer cassette CR disposed on the cassette table 20 and the process station 11.

The wafer transfer mechanism 21 includes a wafer transfer arm 21a movable both in the cassette arranging direction (X-direction) and in the arranging direction of the wafers W within the wafer cassette CR (vertical direction) and slidable toward the cassette table 20 (Y-direction). It is possible for the wafer transfer arm 21a to gain access selectively to any of the wafer cassettes CR and the wafers W housed in the wafer cassette CR.

Also, the wafer transfer arm 21a is swingable in the θ-direction shown in FIG. 1 so as to be capable of gaining access to an alignment unit (ALIM) and an extension unit (EXT) belonging to a third process section $G_3$, which is referred to herein later, on the side of the process station 11.

The process station 11 is provided with a plurality of process units for carrying out a series of processing in applying a resist coating and developing to the wafer W. These process units are arranged one upon the other so as to form a multi-stage structure in a prescribed position such that the wafers W are processed one by one. As shown in FIG. 1, a wafer transfer passageway 22a is formed in the central portion of the process station 11, and a main wafer transfer mechanism 22 is arranged in the wafer transfer passageway 22a. Also, all the process units are arranged around the wafer transfer passageway 22a. These plural process units are classified into a plurality of process sections, and a plurality of process units are arranged in each process section in the vertical direction (Z-direction) so as to form a multi-stage structure.

As shown in FIG. 3, the main wafer transfer mechanism 22 includes a cylindrical support body 49, and a wafer transfer device 46 movable in the vertical direction (Z-direction) is arranged within the cylindrical support body 49. The cylindrical support body 49 can be rotated by the rotary driving force generated by a motor (not shown), and the wafer transfer device 46 can be integrally rotated in accordance with rotation of the cylindrical support body 49. The wafer transfer device 46 comprises a plurality of holding members 48 movable back and forth. Delivery of the wafer W between different process units can be performed by the operation of the holding members 48.

As shown in FIG. 1, first, second, third and fourth process sections $G_1$, $G_2$, $G_3$ and $G_4$ are arranged around the wafer transfer passageway 22a in the resist coating and developing system 1. The first and second process sections $G_1$ and $G_2$ are arranged side by side on the front side (lower side in FIG. 1) of the resist coating and developing system 1, the third process section $G_3$ is arranged on the side of the cassette station 10, and the fourth process section $G_4$ is arranged on the side of the interface section 12.

A resist coating unit (COT) consisting of two spinner type process units for applying a prescribed treatment to a wafer W held on a spin chuck (not shown) within a coater cup (CP) is arranged within the first process section $G_1$. Also, a developing unit (DEV) for developing a pattern of a resist is arranged above the resist coating unit (COT) within the first process section $G_1$. Likewise, a resist coating unit (COT) consisting of two spinner type process units is arranged within the second process section $G_2$, and a developing unit (DEV) is arranged above the resist coating unit (COT) within the second process section $G_2$.

In the third process unit $G_3$, a plurality of oven type process units, in which a prescribed process is applied to the wafer W disposed on a support table SP, are arranged one upon the other so as to form a multi-stage structure, as shown in FIG. 3. To be more specific, the third process section $G_3$ comprises an adhesion unit (AD) for applying a so-called "hydrophobic treatment" for improving the fixing properties of the resist, an alignment unit (ALIM) for performing the position alignment, an extension unit (EXT)

for transferring the wafer into and out of the process unit, a cooling unit (COL) for cooling the wafer W, and four hot plate units (HP) for heating the wafer W before and after the light exposure and after the development, which are superposed one upon the other in the order mentioned as viewed from the bottom so as to form an 8-stage structure. Incidentally, it is possible to arrange a cooling unit (COL) in place of the alignment unit (ALIM) and to allow the cooling unit (COL) to perform the aligning function, too.

A plurality of oven type process units are also stacked one upon the other to form a multi-stage structure in the fourth process section $G_4$, too. To be more specific, a cooling unit (COL), an extension-cooling unit (EXTCOL) acting as a wafer delivery section equipped with a cooling plate, an extension unit (EXT), a cooling unit (COL), and four hot plate units (HP) are stacked one upon the other within the fourth process section $G_4$ as viewed from the bottom so as to form an 8-stage structure.

Incidentally, it is possible to arrange a fifth process section $G_5$ behind the main wafer transfer mechanism 22. In this case, the fifth process section $G_5$ is movable sideward as viewed from the main wafer transfer mechanism 22 along a guide rail 25. It follows that, even in the case of arranging the fifth process section $G_5$, a free space can be ensured behind the main wafer transfer mechanism 22 by sliding the fifth process section $G_5$ along the guide rail 25 so as to make it possible to apply easily the maintenance operation to the main wafer transfer mechanism 22 from behind the main wafer transfer mechanism 22.

The interface section 12 has a length equal to that of the process station 11 in the depth direction. As shown in FIGS. 1 and 2, a pickup cassette CR that can be transferred and a stationary buffer cassette BR are arranged one upon the other in the front portion of the interface section 12. Also, a peripheral light exposure device 23 and a wafer transfer mechanism 24 are arranged in the back portion and the central portion of the interface section 12, respectively.

The wafer transfer mechanism 24 includes a wafer transfer arm 24a. The wafer transfer arm 24a is movable in a direction perpendicular to the X-direction, slidable in a Y-direction, and swingable in the θ-direction so as to be capable of gaining access to the cassettes CR, BR, the peripheral light exposure device 23, an extension-cooling unit (EXTCOL) belonging to the fourth process section $G_4$, and a wafer transfer table on the side of a light exposure device (not shown) positioned adjacent to the interface section 12.

In the resist coating and developing system 1 of the construction described above, the wafer transfer arm 21a of the wafer transfer mechanism 21 gains access first to the wafer cassette CR housing unprocessed wafers W and disposed on the cassette table 20 in the cassette station 10 so as to take a single wafer W out of the wafer cassette CR and, then, transfers the wafer W into the extension unit (EXT) belonging to the third process section $G_3$.

The wafer W is transferred by the wafer transfer device 46 of the main wafer transfer mechanism 22 from the extension unit (EXT) into the process station 11. Then, the wafer W is aligned in the alignment unit (ALIM) belonging to the third process section $G_3$ and, then, transferred into the adhesion process unit (AD). A hydrophobic treatment (HMDS treatment) is applied to the water W within the adhesion process unit (AD) for improving the fixing properties of the resist. Since heating accompanies the hydrophobic treatment, the wafer W after the hydrophobic treatment is transferred by the wafer transfer device 46 into the cooling unit (COL) so as to be cooled.

The wafer W cooled in the cooling unit (COL) after the treatment in the adhesion process unit (AD) or a wafer W to which the treatment within the adhesion unit is not applied is then transferred by the wafer transfer device 46 into the resist coating unit (COT) so as to be coated with a resist solution. As a result, a resist film is formed on the wafer W. After completion of the coating processing, the wafer W is pre-baked within the hot plate unit (HP) belonging to any of the third and fourth process sections $G_3$ and $G_4$ and, then, cooled in any of the cooling units (COL).

The cooled wafer W is transferred into the alignment unit (ALIM) belonging to the third process section $G_3$ so as to be aligned, and then, transferred into the interface section 12 through the extension unit (EXT) belonging to the fourth process section $G_4$.

In the interface section 12, a peripheral light exposure is applied to the wafer W by the peripheral light exposure device 23 so as to remove the extra resist from the wafer W. Then, the wafer W is transferred into the light exposure device (not shown) positioned adjacent to the interface section 12 for application of a light exposure in a prescribed pattern to the resist film formed on the wafer W.

The wafer W after the light exposure is brought back again into the interface section 12 and is transferred by the wafer transfer mechanism 24 into the extension unit (EXT) belonging to the fourth process section $G_4$. Further, the wafer W is transferred by the wafer transfer device 46 into any of the hot plate units (HP) for application of a post-exposure treatment to the wafer W and, then, cooled in the cooling unit (COL).

In the next step, the wafer W is transferred into the developing unit (DEV) for application of a development to the light-exposed pattern. After completion of the development, the wafer W is transferred into any one of the hot plate units (HP) for application of a post-baking treatment to the wafer W and, then, is cooled in the cooling unit (COL). After completion of a series of processing described above, the wafer W is brought back to the cassette station 10 through the extension unit (EXT) belonging to the third process section $G_3$ so as to be housed in any of the wafer cassettes CR.

Figure 4:
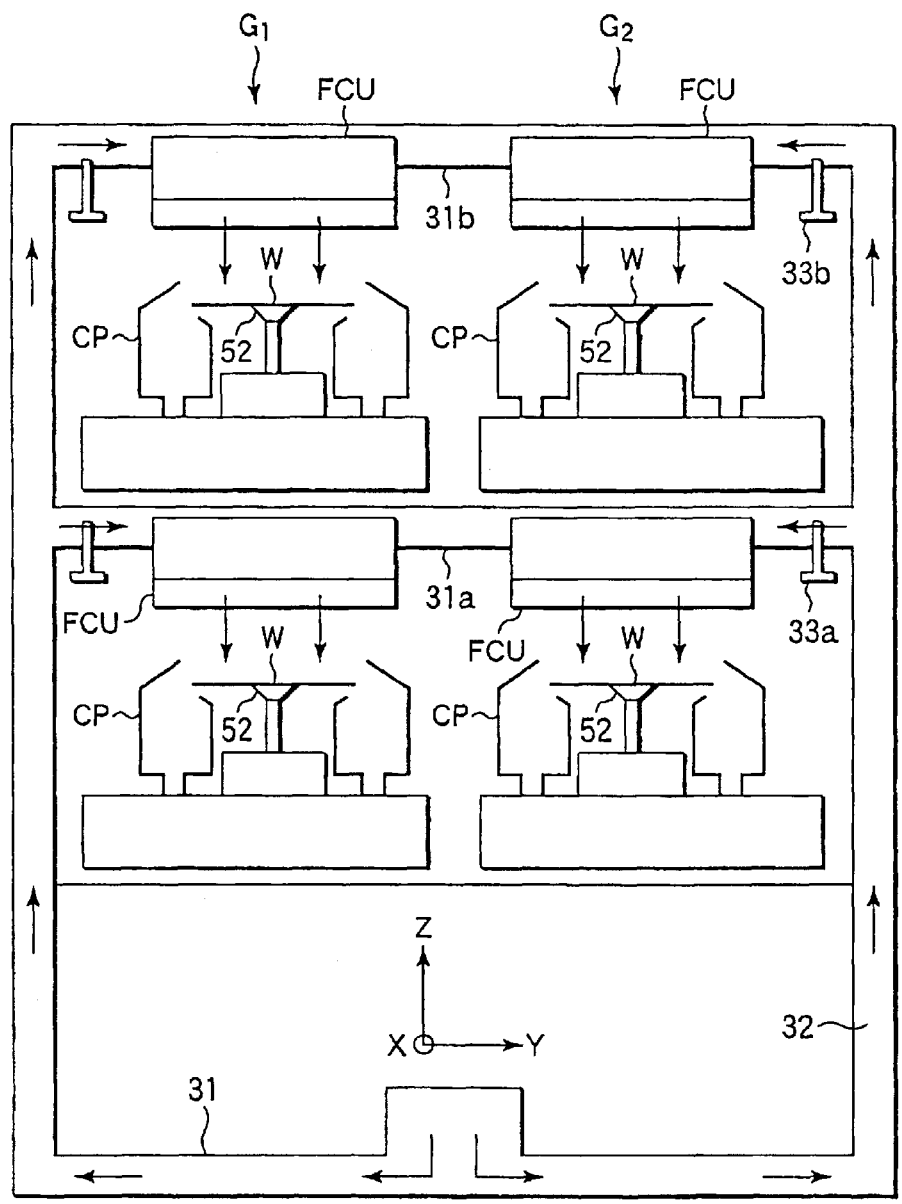
FIG. 4 schematically shows the construction of an air supply mechanism arranged in each of the first process section and the second process section included in the resist coating and developing system shown in FIG. 1.
Figure 5:
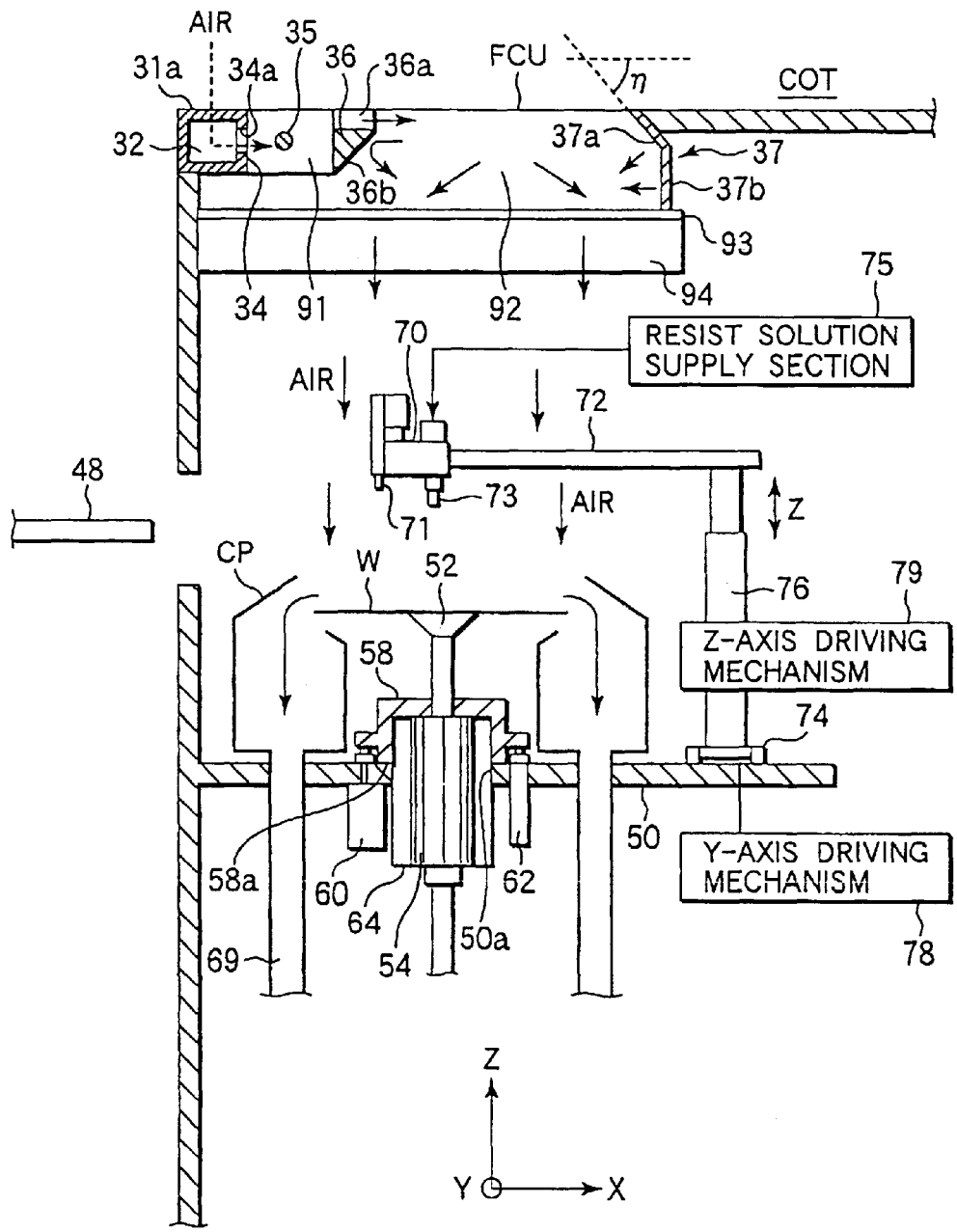
FIG. 5 is a cross sectional view schematically showing the construction of the resist coating unit (COT) included in the resist coating and developing system shown in FIG. 1.
Figure 6:
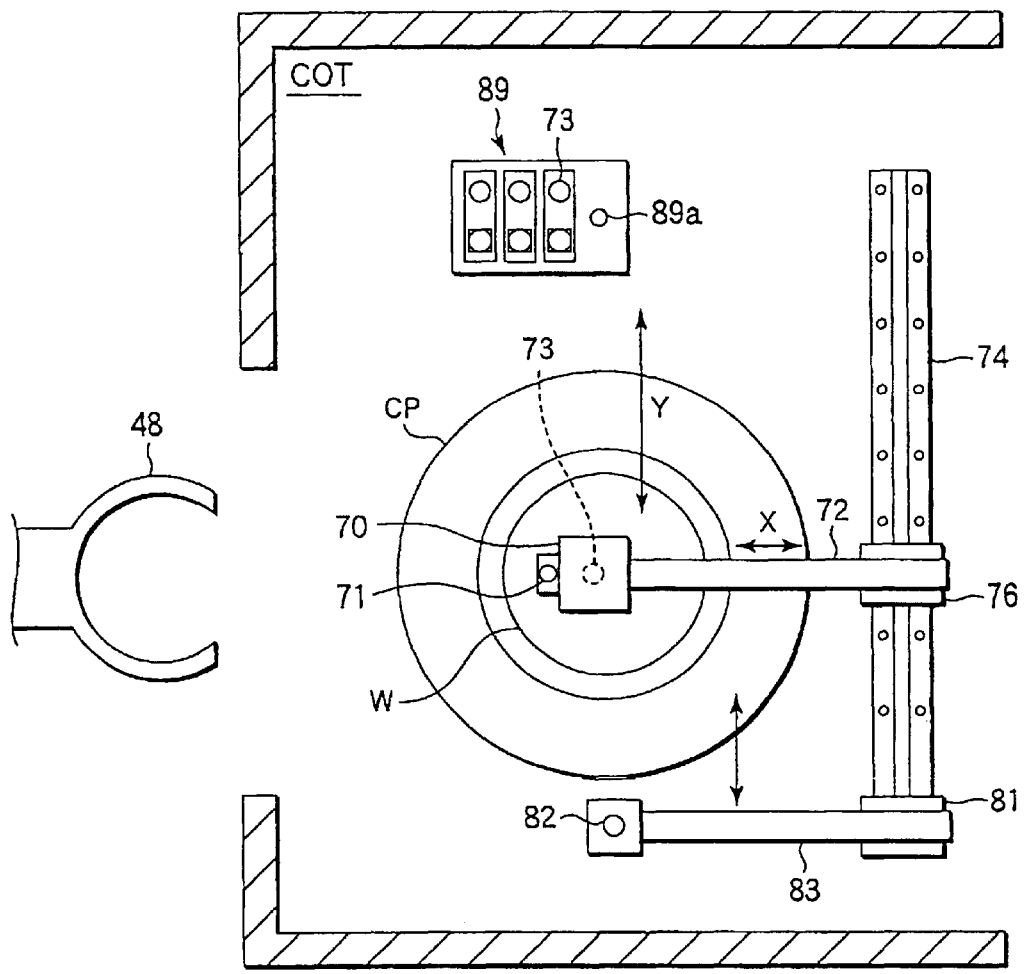
FIG. 6 is a plan view schematically showing the construction of the resist coating unit (COT) shown in FIG. 5.

The resists coating unit (COT) referred to above will now be described in detail. FIG. 4 schematically shows the construction of an air supply mechanism arranged in each of the first process section $G_1$ and the second process section $G_2$, FIG. 5 is a cross sectional view schematically showing the entire construction of the resist coating unit (COT), and FIG. 6 is a plan view schematically showing the construction of the resist coating unit (COT).

A clean air whose temperature and humidity are controlled and having particles and the like removed therefrom is supplied by an air supply mechanism into each of the resist coating unit (COT) and the developing unit (DEV) arranged in each of the first process section $G_1$ and the second process section $G_2$.

The air supply mechanism comprises a hollow frame 31, a blowing device (not shown) for blowing the air into the hollow frame 31, and a filter chamber unit (FCU) for taking in the air flowing inside the hollow frame 31. The hollow frame 31 constitutes a part of the frame constituting the first process section $G_1$ and the second process section $G_2$, and an air blowing passageway 32 is formed inside the hollow frame 31. An air blowing pump, a piping of a factory for supplying the air, etc. are used as the air blowing device for blowing the air into the air blowing passageway 32. The arrows put within the air blowing passageway 32 in FIG. 4 denote the air blowing route. It is possible to decrease the space of the resist coating and developing system 1 by arranging the air blowing passageway 32 within the hollow frame 31.

In the resist coating unit (COT), the filter chamber unit (FCU) is mounted to a frame 31a included in the hollow frame 31, said frame 31a being arranged horizontally in an upper portion of the resist coating unit (COT). Likewise, in the developing unit (DEV), the filter chamber unit (FCU) is mounted to a frame 31b horizontally arranged in an upper portion of the developing unit (DEV).

A damper 33a is mounted to the frame 31a. It is possible to change the air blowing rate into the resist coating unit (COT) by controlling the degree of opening of the damper 33a. Incidentally, a damper 33b is mounted similarly to the frame 31b. It is possible to change the air blowing rate into the developing unit (DEV) by controlling the degree of opening of the damper 33b.

An annular coater cup (CP) is arranged in the central portion of the resist coating unit (COT), and a spin chuck 52 is inside the coater cup (CP). The spin chuck 52 having the wafer W fixed thereto by means of a vacuum suction is rotated by a driving motor 54. A drain 69 is formed in the bottom portion of the coater cup (CP). The process solution such as an undesired resist solution, which is centrifugally removed from the wafer W, is discharged to the outside through the drain 69.

The driving motor 54 is arrange movable in the vertical direction in an opening 50a formed in a unit bottom plate 50 and joined to a vertical driving means 60 consisting of an air cylinder and to a vertical guide means 62 via a cap-shaped flange member 58 made of, for example, aluminum. A cylindrical cooling jacket 64 made of, for example, SUS is mounted to the side wall of the driving motor 54, and the flange member 58 is mounted to the cooling jacket 64 in a manner to cover the upper half of the cooling jacket 64.

When the wafer W is coated with, for example, a resist solution, the lower end 58a of the flange member 58 is brought into a tight contact with the unit bottom plate 50 in the vicinity of the outer circumference of the opening 50a, thereby hermetically sealing the inner space of the unit. When the wafer W is transferred between the spin chuck 52 and the holding member 48 of the main wafer transfer mechanism 22, the vertical driving means 60 moves upward the driving motor 54 and the spin chuck 52 so as to permit the lower end of the flange member 58 to float from the unit bottom plate 50.

A resist spurting nozzle 73 for spurting a resist solution onto the wafer W is detachably mounted to the tip portion of a nozzle scan arm 72 with a nozzle holding body 70 interposed therebetween. A resist solution is supplied from a resist solution supply section 75 to the resist spurting nozzle 73. The nozzle scan arm 72 is mounted to a vertical support member 76 movable along a guide rail 74 mounted to extend in one direction (Y-direction) on the unit bottom plate 50 and is moved by a Y-axis driving mechanism 78 in the Y-direction together with the vertical support member 76. Also, the resist spurting nozzle 73 can be moved in the vertical direction (Z-direction) by a Z-axis driving mechanism 79.

Incidentally, the resist spurting nozzle 73 is selectively attached or replaced in a nozzle waiting section 89 in which the resist spurting nozzle 73 is allowed to rest and, thus, the nozzle scan arm 72 can also be moved in the X-direction by an X-axis driving mechanism (not shown).

In the nozzle waiting section 89, the spurting port of the resist spurting nozzle 73 is inserted into a port 89a of a solvent atmosphere chamber so as to be exposed to the atmosphere of the solvent. As a result, the resist solution at the tip of the resist spurting nozzle 73 is prevented from being solidified or deteriorated. A plurality of the resist spurting nozzles 73 are arranged in the nozzle waiting section 89, and which of these nozzles 73 to use is determined in accordance with, for example, the kind of the resist solution. In this connection, a plurality of different kinds of resist solutions are supplied from the resist solution supply section 75 into the resist spurting nozzles 73.

A thinner nozzle 71 for spurting a solution for wetting the surface of the wafer W prior to the spurting of a resist solution onto the surface of the wafer W, e.g., for spurting a thinner, is also mounted to the nozzle holding body 70. The thinner nozzle 71 is connected to a thinner supply section through a solvent supply pipe (not shown). The position where a thinner is spurted from the thinner nozzle 71 onto the wafer W is adjusted by the Y-axis driving mechanism 78 and the X-axis driving mechanism (not shown).

A vertical support member 81 supporting another nozzle scan arm 83 and movable in the Y-direction is arranged on the guide rail 74. Also, a rinsing nozzle 82 for performing a side rinsing is mounted to the tip portion of nozzle scan arm 83. The waiting site of the nozzle scan arm 83 and the rinsing nozzle 82 is formed outside the coater cup (CP) shown in FIG. 6, and the rinsing nozzle 82 is movable in the Y-direction so as to be positioned in the peripheral portion of the wafer W. A solvent (volatile solvent) contained in the resist solution is suitably used as the rinsing solution (washing solution). The resist film is removed from the peripheral portion of the wafer W by the treatment with such a solvent.

Figure 7:
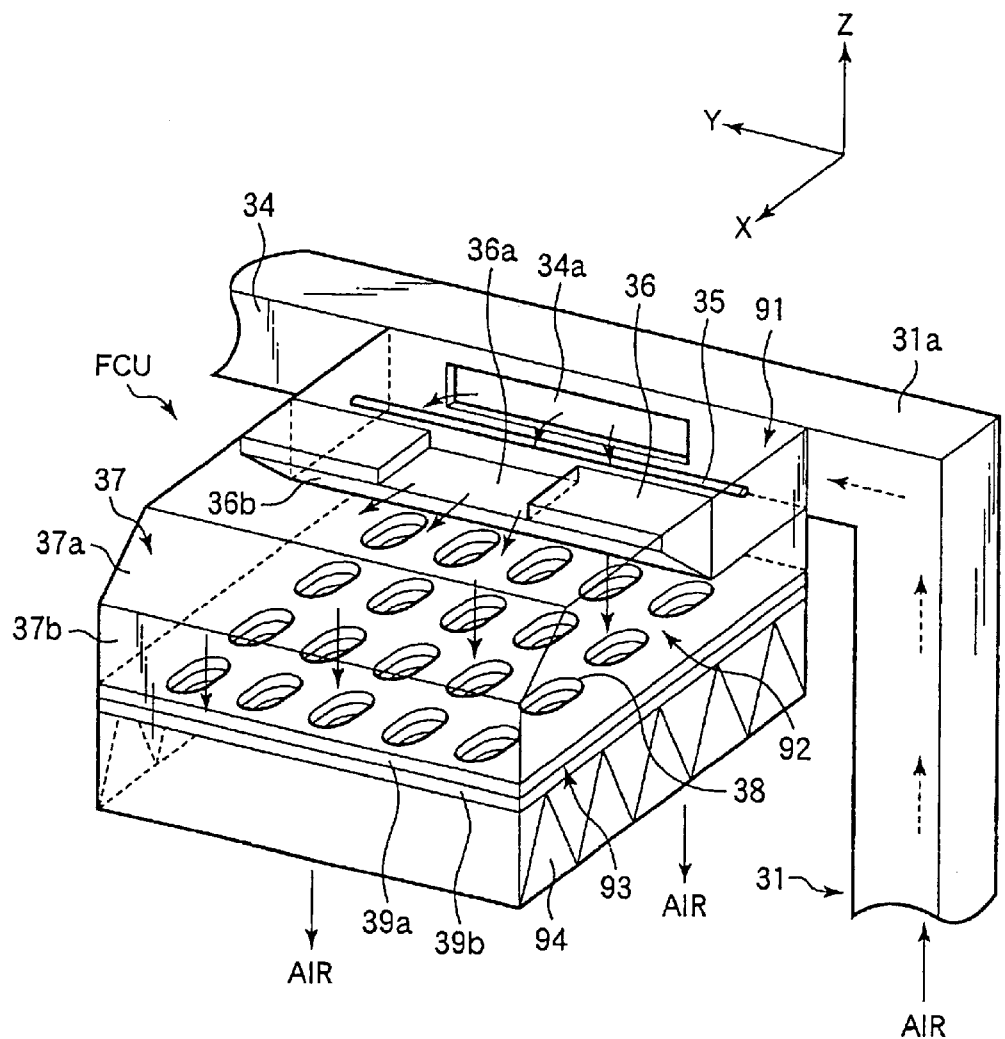
FIG. 7 schematically shows the construction of a filter chamber unit (FCU) included in the resist coating unit (COT) shown in FIG. 5.

The filter chamber unit (FCU) for supplying a clean air whose temperature and humidity are adjusted into the coater cup (CP) is arranged in an upper portion within the resist coating unit (COT). FIG. 7 schematically shows the inner construction of the filter chamber unit (FCU). Incidentally, FIG. 5 is a side view schematically showing the construction of the filter chamber unit (FCU).

In the frame 31a, a first open portion 34a is formed in the vertical wall 34 facing the inside of the resist coating unit (COT). The air flowing inside the frame 31a (the air blowing passageway 32) is introduced into the filter chamber unit (FCU) through the first open portion 34a.

The filter chamber unit (FCU) comprises a first air introducing chamber 91 into which the air flowing inside the frame 31a is introduced first through the first open portion 34a, a second air introducing chamber 92 communicating with the first air introducing chamber 91 so as to permit the air to be introduced from the first air introducing chamber 91 into the second air introducing chamber 92, a filter unit 94 for filtering the air introduced into the second air introducing chamber 92 so as to obtain a clean air and for supplying the clean air into the coater cup (CP), and air stream control mechanism 93 arranged between the second air introducing chamber 92 and the filter unit 94 for controlling the air stream flowing from the second air introducing chamber 92 into the filter unit 94.

The first open portion 34a has an open area so as to pass a desired amount of the air to be supplied into the coater cup (CP) just enough from the air blowing passageway 32 into the first air introducing chamber 91. Where the first open portion 34a is oblong in which the length in the longitudinal direction of the frame 31a provides the longer side, it is possible to apply easily the processing to form the first open portion 34a in the frame 31a. It is also possible to form, for example, a plurality of circular or square open portions in the frame 31a such that these open portions are arranged in the longitudinal direction of the frame 31a.

A heater 35 for heating the air introduced into the first air introducing chamber 91 to a desired temperature is arranged within the first air introducing chamber 91. The heater 35 is shaped like, for example, a rod, and the rod-shaped heater 35 is held within the first air introducing chamber 91 such that the longitudinal direction of the heater 35 is substantially parallel to the longitudinal direction of the frame 31a. The flow of the air flowing into the first air introducing chamber 91 is complex as described herein later. In this connection, it is desirable for the shape of the heater 35 to conform with the shape of the first open portion 34a so as to permit the air introduced into the first air introducing chamber 91 to be heated as uniformly as possible.

It should be noted that, if a plurality of the heaters 35 are arranged within the first air introducing chamber, it is possible for the temperature gradient to be formed in the air within the first air introducing chamber. Such being the situation, it is desirable for a single heater 35 to be arranged in the first air introducing chamber.

The air flows in the Y-direction within the frame 31a, and the flowing direction of the air is changed into the X-direction when the air flows into the first air introducing chamber 91. It should be noted, however, that almost all the air flowing into the first air introducing chamber 91 does not constitute an air stream flowing purely in the X-direction and is considered to form an air stream flowing in an oblique direction including both the component in the X-direction and the component in the Y-direction into the first air introducing chamber 91. Also, a flowing velocity distribution is considered to be generated in the air stream flowing into the first air introducing chamber 91. Under the circumstances, it is desirable for the air stream introduced into the first air introducing chamber 91 to be rectified and made substantially uniform in the temperature distribution within the first air introducing chamber 91 and, then, to flow out into the second air introducing chamber 92. In this case, the temperature distribution of the air introduced into the coater cup (CP) can be made uniform.

In order to realize the particular state, a first wall section 36, which is a wall section for forming the first air introducing chamber 91, is formed to face the vertical wall 34 (the first open portion 34a) in the filter chamber unit (FCU) so as to provide a partition wall between the first air introducing chamber 91 and the second air introducing chamber 92. The wall surface of the first wall section 36 on the side of the first air introducing chamber 91 forms a substantially vertical plane. Also, a second open portion 36a is formed in the first wall section 36 so as to permit the first air introducing chamber 91 to communicate with the second air introducing chamber 92.

The second open portion 36a is formed on an upper side in the central portion of the first wall section 36 in the horizontal direction (Y-direction). The area in which the air introduced into the first air introducing chamber 91 collides against the first wall section 36 can be enlarged by forming the second open portion 36a in the first wall section 36 as described above. To be more specific, it is possible in this case to suppress the flow of the air, which has passed through the first open portion 34a, into the second air introducing chamber 92 directly through the second open portion 36a. As a result, the air is stirred within the first air introducing chamber 91 so as to promote the uniformity of the temperature distribution. Also, the flowing velocity distribution of the air flowing from the second open portion 36a into the second air introducing chamber 92 can be made uniform because the flow of the air is changed.

The air whose temperature distribution and flowing velocity distribution have been made uniform in the first air introducing chamber 91 flows from the first air introducing chamber 91 into the second air introducing chamber 92 through the second open portion 36a.

It should be noted that the second open portion 36a is formed on the upper side of the first wall section 36 as described previously. As a result, the air introduced into the first air introducing chamber 91 is also allowed to collide against that portion of the first wall section 36 which is positioned below the second open portion 36a so as to promote the stirring of the air within the first air introducing chamber 91 and, thus, to improve the uniformity in the temperature of the air within the first air introducing chamber 91. Also, since the warm air is migrated in general so as to be positioned above the cold air, the flow of the air that is not heated by the heater 35 from the first air introducing chamber 91 into the second air introducing chamber 92 can be suppressed by arranging the second open portion 36a on the upper side of the first wall section 36. As a result, it is possible to facilitate the flow of the air heated by the heater 35 from the first air introducing chamber 91 into the second air introducing chamber 92.

It should be noted that, where the damper 33a is adjusted so as to change the air blowing rate within the frame 31a, the flowing direction of the air stream flowing into the first air introducing chamber 91 is changed. As a result, changes are generated in the flow of the air within the first air introducing chamber 91 and in the flow of the air flowing into the second air introducing chamber 92 through the second open portion 36a. It follows that the air poor in the uniformity of the temperature distribution tends to flow into the second air introducing chamber 92 so as to give rise to the problem that the air having a high temperature gradient is supplied into the coater cup (CP). Such being the situation, it is desirable that the open area of the second open portion 36a can be change in accordance with the change in the air blowing rate within the frame 31a achieved by adjusting the opening degree of the damper 33a.

Figure 8A:
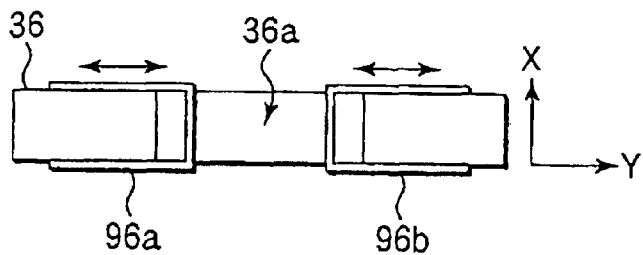
FIG. 8A is a plan view showing the construction of a shutter arranged in the second open portion within the filter chamber unit (FCU) shown in FIG. 7.
Figures 8B, 8C:
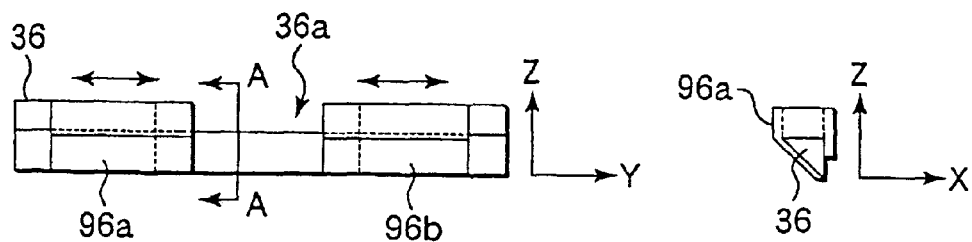
FIG. 8B is a front view showing the construction of the shutter shown in FIG. 8A.
FIG. 8C is a cross sectional view taken along the line A—A shown in FIG. 8B.

FIG. 8A is a plan view exemplifying the construction of a shutter for changing the open area of the second open portion 36a, FIG. 8B is a front view showing the shutter shown in FIGS. 8A and 8C is a cross sectional view along the line A—A shown in FIG. 8B. Each of shutters 96a and 96b arranged in the first wall section 36 can be slid by a slide mechanism (not shown) in the Y-direction. The second open portion 36a is rendered fully open when the shutters 96a and 96b are at opposite ends of the first wall section 36 in the Y-direction. On the other hand, if the shutters 96a and 96b are moved closer to the center of the first wall section 36 in the Y-direction such that the distance between the shutters 96a and 96b is shortened, the open area of the second open portion 36a is diminished.

The shutters 96a, 96b can be interlocked with the damper 33a so as to automatically control the opening and closing of the shutters 96a, 96b in accordance with the open amount of the damper 33a. Such an automatic control can be released. Where the automatic control is released, it is possible to design the shutters 96a, 96b slidable freely by the manual operation. It is possible to diminish the opening area of the second open portion 36a by sliding either of the shutters 96a and 96b. However, in view of the aspect that the uniformity of the temperature is improved by controlling the flow of the air within the second air introducing chamber 92, it is desirable for the second open portion 36a adjusted at a desired area to be arranged in the center of the first wall section 36.

Incidentally, where it is desired to control the down flow of the air finally flowing out of the filter unit 94 at a desired flow rate and to improve the uniformity in the temperature distribution of the down flow of the air, it is possible to arrange a plurality of temperature sensor and a plurality of flow rate sensors right under the filter unit 94 so as to measure the temperature distribution and the flow rate distribution right under the filter unit 94 (or above the wafer W) and, thus, to control the opening amount of the damper 33a and the sliding amount of each of the shutters 96a, 96b based on the result of the measurement.

A wall section of the second air introducing chamber 92 facing the first wall section 36, said wall section herein after referred to as "a second wall section 37", has an inclined portion 37a. The air stream introduced into the second air introducing chamber 92 through the second open portion 36a partly collides against the inclined portion 37a so as to be guided downward. The angle η of inclination of the inclined portion 37a, i.e., the angle on the side of the acute angle crossing the horizontal direction, is set to satisfy, for example, the condition of tan η=⅗.

Also, the second wall section 37 includes a vertical portion 37b. The air stream introduced into the second air introducing chamber 92 through the second open portion 36a partly collides against the vertical portion 37b so as to permit the air to flow backward toward the first air introducing chamber 91.

Another inclined portion 36b for guiding downward the air stream flowing into the second air introducing chamber 92, colliding against the vertical portion 37b and flowing backward toward the first wall section 36 is formed in the first wall section 36 on the side of the second air introducing chamber 92. A complex air stream is generated within the second air introducing chamber 92 by the air stream generated by the inclined portion 37a, the returning air stream in the X-direction generated by the vertical portion 37b and the air stream generated by the inclined portion 36b so as to form a down flow of the air having substantially a uniform temperature distribution.

Figure 9:
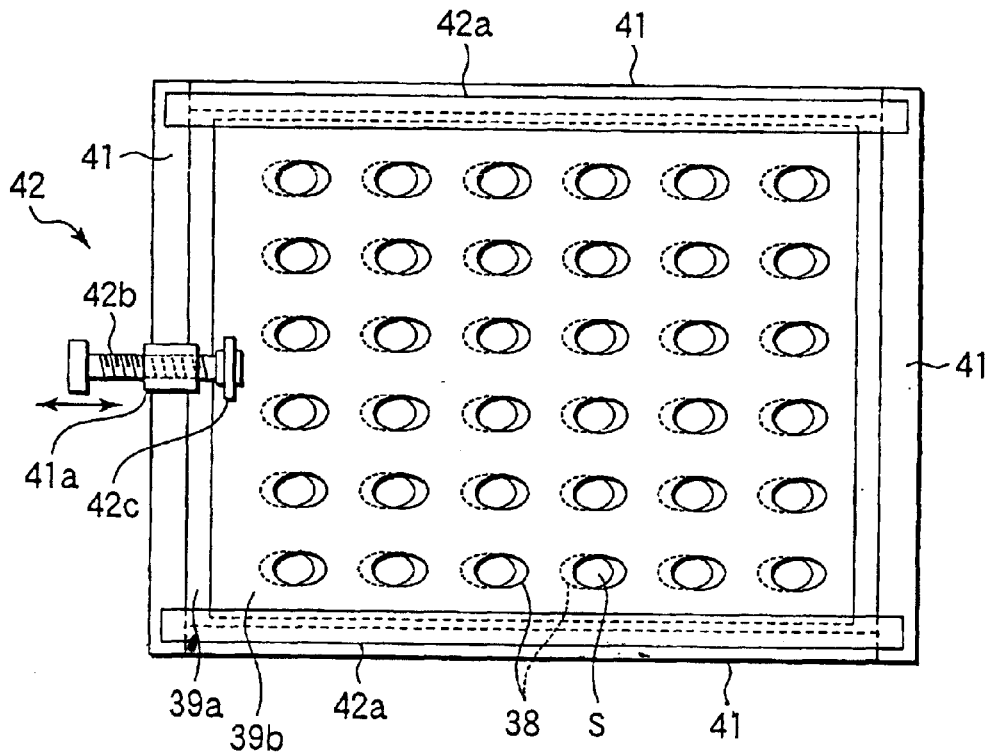
FIG. 9 is a plan view schematically showing the construction of the air stream control mechanism included in the filter chamber unit (FCU) shown in FIG. 7.

The air flows from the second air introducing chamber 92 into the filter unit 94 through the air stream control mechanism 93. FIG. 9 is a plan view showing the construction of the air stream control mechanism 93. As shown in the drawing, the air stream control mechanism 93 comprises two panels 39a, 39b having holes 38 of the same shape formed in a plurality of positions in the same pattern and arranged in parallel such that the front surface of one of these panels faces the back surface of the other panel, a frame-like stationary member 41 for fixing the panel 39a, and a slide mechanism 42 for sliding the panel 39b. Incidentally, it is possible to join the second air introducing chamber 92 to the filter unit 94 by using the stationary member 41.

Each of the panels 39a, 39b can be formed of, for example, a metal plate. Also, it is possible to form the holes 38 in each of the panels 39a, 39b by means of punching or laser processing. Further, the slide mechanism 42 comprises a guide 42a fixed to the stationary member 41 and engaged with the panel 39b, a cylindrical member 41a mounted to the stationary member 41 and threaded internally, and a screw 42b engaged with the cylindrical member 41a so as to be joined to the panel 39b.

A screw groove is not formed in the tip portion of the screw 42b. The tip portion of the screw 42b is engaged with a connecting tool 42c mounted to the panel 39b so as to make it possible to rotate the screw 42b. The position of the connecting tool 42c can be moved in the longitudinal direction of the guide 42a by rotating the screw 42b so as to change the length of that portion of the screw 42b which projects inward from the cylindrical member 41a. In other words, it is possible to slide the panel 39b in the longitudinal direction of the guide 42a.

The overlapping area of the holes 38, i.e., an open area S, can be changed by changing the sliding amount of the panel 39b so as to control the air blowing amount from the second air introducing chamber 92 into the filter unit 94. It is possible to construct the air stream control mechanism 93 such that the control of the rotation of the screw 42b, i.e., the control of the open area of the overlapping holes 38, is interlocked with the operation of the damper 33a.

It is also possible to slide the panel 39b by using an air cylinder in place of the screw 42b. In this case, the panel 39b is fixed to the tip of the air cylinder, and the elongating-shrinking amount of the air cylinder is changed so as to slide the panel 39b. Further, it is possible to slide the panel 39b by employing the method of changing the rotational displacement obtained by rotating a motor into a linear displacement.

The air passing through the air stream control mechanism 93 passes through the filter unit 94, and the particles and the like are removed from the air when the air passes through the filter unit 94. The air passing through the filter unit 94 is then blown into the coater cup (CP). An ULPA filter is suitably used in the filter unit 94. The filter unit 94 also plays the role of making uniform the flowing velocity distribution of the air at the blowing port from the filter unit 94.

It is possible to blow the air excellent in the uniformity of the temperature distribution and the flowing velocity distribution into the coater cup (CP) by using the filter chamber unit (FCU) of the construction described above. As a result, it is possible to render the thickness of the resist film formed on the wafer W within the coater cup (CP) substantially uniform over the entire region of the wafer W. It is also possible to control finely the thickness of the resist film. It follows that the reliability of the manufactured semiconductor device can be improved.

The process step in the resist coating unit (COT) is carried out in general as follows. In the first step, the filter chamber unit (FCU) arranged within the resist coating unit (COT) is operated so as to blow the air whose temperature and humidity are controlled into the coater cup (CP). As a result, the environment around the wafer W held by the spin chuck 52 within the coater cup (CP) can be maintained constant.

In the next step, the wafer W is transferred to a position right above the coater cup (CP) within the resist coating unit (COT) by the holding member 48 of the main wafer transfer mechanism 22 and, then, the wafer W is delivered onto the spin chuck 52 moved upward by the vertical driving means 60 and the vertical guide means 62. After the wafer W is held by the spin chuck 52 by, for example, the vacuum suction, the main wafer transfer mechanism 22 brings the holding member 48 back from within the resist coating unit (COT), thereby finishing the transfer of the wafer W into the resist coating unit (COT).

Then, the spin chuck 52 is moved downward until the wafer W is positioned at a prescribed height within the coater cup (CP). Also, the driving motor 54 is operated so as to rotate the spin chuck 52, and the nozzle holding body 70 is moved from the nozzle waiting section 89 in the Y-direction along th guide rail 74 so as to permit the nozzle holding body 70 to be positioned substantially right above the center of the wafer W.

Further, the spurting port of the thinner nozzle 71 is positioned right above the center of the spin chuck 52, i.e., right above the center of the wafer W, so as to supply a prescribed amount of the thinner to the surface of the rotating wafer W. The thinner supplied onto the surface of the wafer W is centrifugally expanded uniformly from the center of the wafer W over the entire periphery of the wafer W. By wetting the entire surface of the wafer W with a solvent such as a thinner prior to the coating of a resist solution in this fashion, i.e., by applying a so-called "pre-wetting treatment", the expansion of the resist solution is facilitated in the subsequent step, with the result that it is possible to form a uniform resist film on the surface of the wafer W by using a small amount of the resist solution.

In the next step, the spurting port of the resist spurting nozzle 73 is positioned right above the center of the wafer W so as to spurt a resist solution from the spurting port of the resist spurting nozzle 73 onto the center on the surface of the rotating wafer W. As a result, the resist solution is centrifugally expanded from the center of the wafer W toward the periphery of the wafer W, thereby forming a resist film on the wafer W. After the dripping of the resist solution is finished, the wafer W is rotated at a prescribed rotating speed so as to adjust the thickness of the resist film. If the rotating speed of the wafer W is increased, an extra resist solution is centrifugally removed from the wafer W and the drying of the wafer W is promoted, thereby forming a resist film having a prescribed thickness.

Then, the resist spurting nozzle 73 is housed in the nozzle waiting section 89. A back rinsing treatment is applied to the back surface of the wafer W held by the spin chuck 52 by a washing means (not shown), and a side rinsing treatment is applied, as required, to the peripheral portion of the wafer W by using the rinsing nozzle 82. After the rinsing treatment, the wafer W is kept rotated for a prescribed time so as to centrifugally remove the remaining rinsing solution and, then, the rotation of the wafer W is stopped, thereby finishing the resist coating processing.

During the series of the processing for coating the resist solution, the wafer W is held under the air atmosphere blown from the filter chamber unit (FCU), which is excellent in the temperature distribution and the flowing velocity distribution. As a result, it is possible to form resist films low in the nonuniformity in the thickness (i.e., excellent in the uniformity of the thickness), and low in the defects, when the resist films are formed on a plurality of wafers W. Also, the accuracy of the processing for removing the undesired resist by using a rinsing solution such a thinner can be maintained constant.

The wafer W having a resist film formed thereon is transferred from the spin chuck 52 onto the holding member 48 through the route opposite to that in the previous step of transferring the wafer W from the holding member 48 onto the spin chuck 52 so as to be housed in any of the hot plate units (HP) belonging to the third process section $G_3$ or fourth process section $G_4$ for application of a pre-baking treatment to the wafer W.

The present invention is not limited to the embodiment described above. For example, in the developing unit (DEV) using the filter chamber unit (FCU), it is possible to maintain constant the developing atmosphere. Therefore, it is possible to suppress the change in the temperature of the developing solution so as to make it possible to carry out the developing processing accurately. Also, in the embodiment described above, the filter chamber unit (FCU) is used in a liquid processing unit using a resist solution or a developing solution. However, it is also possible to arrange the filter chamber unit (FCU) in, for example, a heat treating device. Further, in the embodiment described above, a semiconductor wafer is taken up as a substrate to be processed. However, the technical idea of the present invention can also be applied to an apparatus for processing another substrate such as a liquid crystal display (LCD) substrate.

It should be noted that the embodiments described above are simply intended to clarify the technical idea of the present invention. Naturally, the technical scope of the present invention should not be construed solely on the basis of the specific embodiments described above. In other words, the present invention can be worked in variously modified fashions on the basis of the spirit of the present invention and within the scope defined in the accompanying claims.

What is claimed is:

1. A substrate processing apparatus, comprising:
    a substrate process section for applying a prescribed processing to a substrate; and
    an air supply mechanism for supplying an air controlled at a prescribed temperature from above the substrate process section into the substrate process section;
    wherein, said air supply mechanism comprises:
        a tubular body having a substantially vertical wall and extending in a horizontal direction;
        an air blowing device for blowing an air into said tubular body;
        a first open portion formed in said vertical wall;
        a first air introducing chamber arranged in a direction perpendicular to the longitudinal direction of the tubular body for taking in an air flowing within the tubular body through said first open portion and having a wall section facing said vertical wall;
        a heater arranged within said first air introducing chamber for heating the air introduced into the first air introducing chamber;
        a second open portion formed on the upper side in the central portion of the wall section of said first air introducing chamber;
        a second air introducing chamber communicating with the first air introducing chamber via said second open portion and taking in the air heated by said heater through the second open portion;
        a filter unit arranged below said second air introducing chamber for filtering the air introduced into the second air introducing chamber so as to supply a clean air into said substrate process section; and
        an air stream control mechanism arranged between the second air introducing chamber and said filter unit for controlling the flow of the air from the second air introducing chamber into the filter unit.

2. The substrate processing apparatus according to claim 1, wherein the opening of said first open portion is shaped substantially oblong in which the length of the first open portion in the longitudinal direction of said tubular body provides the longer side of the oblong opening.

3. The substrate processing apparatus according to claim 1, wherein said heater is shaped like a rod, and said heater is arranged within said first air introducing chamber such that the longitudinal direction of the heater is substantially parallel to the longitudinal direction of said tubular body.

4. The substrate processing apparatus according to claim 1, wherein said air supply mechanism further comprises a shutter changeable the open area of said second open portion.

5. The substrate processing apparatus according to claim 1, wherein said second air introducing chamber has a wall section facing the wall section having said second open portion formed therein, and said wall section of said second air introducing chamber includes an inclined portion for guiding downward the air introduced through said second open portion.

6. The substrate processing apparatus according to claim 5, wherein said inclined portion is formed in a height facing said second open portion formed in the wall section of said second air introducing chamber.

7. The substrate processing apparatus according to claim 1, wherein the wall section having said second open portion formed therein includes an inclined portion for guiding downward the air, which has been introduced into said second air introducing chamber and, then, collided against the wall section of the second air introducing chamber so as to be returned toward the wall section having said second open portion formed therein.

8. The substrate processing apparatus according to claim 7, wherein the angle $\eta$ of inclination of the inclined section included in the wall section having said second open portion formed therein satisfies the condition of tan $\eta=3/5$.

9. The substrate processing apparatus according to claim 1, wherein said air stream control mechanism comprises:

two panels having holes of the same shape arranged in a plurality of positions thereof in the same pattern and arranged in parallel such that the front surface of one of said two panels faces the back surface of the other panel;

a stationary member for fixing one of said panels; and a slide mechanism for sliding the other panel so as to change the overlapping area of the holes.

10. The substrate processing apparatus according to claim 1, further comprising a housing having said substrate process section housed therein and including a plurality of frame members, said tubular body being one of said plural frame members.

* * * * *